US011509219B2

(12) United States Patent
Matthews et al.

(10) Patent No.: US 11,509,219 B2
(45) Date of Patent: Nov. 22, 2022

(54) RESERVOIR CAPACITOR FOR BOOST CONVERTERS

(71) Applicant: Power Integrations, Inc., San Jose, CA (US)

(72) Inventors: David Michael Hugh Matthews, Los Gatos, CA (US); Balu Balakrishnan, Saratoga, CA (US)

(73) Assignee: Power Integrations, Inc, San Jose, CA (US)

( * ) Notice: Subject to any disclaimer, the term of this patent is extended or adjusted under 35 U.S.C. 154(b) by 447 days.

(21) Appl. No.: 16/832,665

(22) Filed: Mar. 27, 2020

(65) Prior Publication Data

US 2021/0152087 A1    May 20, 2021

Related U.S. Application Data

(60) Provisional application No. 62/935,858, filed on Nov. 15, 2019.

(51) Int. Cl.
*H02M 3/158* (2006.01)
*H03K 3/356* (2006.01)
*H03K 17/687* (2006.01)
*H02M 1/42* (2007.01)
*H02M 1/08* (2006.01)

(52) U.S. Cl.
CPC ............. *H02M 3/158* (2013.01); *H02M 1/08* (2013.01); *H02M 1/4225* (2013.01); *H03K 3/356017* (2013.01); *H03K 17/6871* (2013.01); *H03K 2217/0063* (2013.01); *H03K 2217/0072* (2013.01)

(58) Field of Classification Search
CPC ...... H02M 3/158; H02M 1/08; H02M 1/4225; H03K 3/356017; H03K 17/6871; H03K 2217/0063; H03K 2217/0072
See application file for complete search history.

(56) References Cited

U.S. PATENT DOCUMENTS

| 5,923,153 A * | 7/1999 | Liu ........................ H02M 3/158 363/59 |
| 6,349,044 B1 * | 2/2002 | Canales-Abarca ..... H02M 1/34 363/56.08 |
| 6,504,497 B2 * | 1/2003 | Jang ........................ H02J 7/345 363/39 |

(Continued)

*Primary Examiner* — Rafael O De Leon Domenech
(74) *Attorney, Agent, or Firm* — Power Integrations, Inc (57) ABSTRACT

A power supply comprising a first-stage capacitor configured to provide energy to a second stage power converter. An energy transfer element coupled to the first-stage capacitor. A reservoir capacitor coupled to the energy transfer element. The reservoir capacitor is configured to receive charge from the energy transfer element. A power switch configured to control a transfer of energy from an input of the power supply to the first-stage capacitor. A controller coupled to the power switch, the controller configured to generate a hold-up signal in response to the input of the power supply falling below a threshold voltage. A charge circuit comprising a first switch and a second switch configured to be controlled by the hold-up signal. The first switch couples the reservoir capacitor to an input of the energy transfer element. The second switch is configured to uncouple the reservoir capacitor from receiving charge from the energy transfer element.

33 Claims, 6 Drawing Sheets

(56) References Cited

U.S. PATENT DOCUMENTS

| | | | |
|---|---|---|---|
| 7,760,524 B2 | 7/2010 | Matthews | |
| 8,247,924 B1 * | 8/2012 | Zoller | H02J 9/061 |
| | | | 307/64 |
| 9,602,009 B1 | 3/2017 | Baurle | |
| 10,418,908 B1 * | 9/2019 | Pastore | H02M 1/4258 |
| 10,826,375 B2 * | 11/2020 | Wang | H02M 3/33523 |
| 10,833,587 B1 * | 11/2020 | Chen | H02M 3/335 |
| 2002/0071300 A1 * | 6/2002 | Jang | H02J 7/345 |
| | | | 363/125 |
| 2008/0055946 A1 * | 3/2008 | Lesso | H02M 3/33561 |
| | | | 363/63 |
| 2017/0358989 A1 * | 12/2017 | Werner | H05B 45/38 |

* cited by examiner

RESERVOIR CAPACITOR FOR BOOST CONVERTERS

CROSS-REFERENCE TO RELATED APPLICATIONS

This application claims priority to U.S. Provisional Application No. 62/935,858, filed on Nov. 15, 2019, the contents of which are incorporated herein by reference in their entirety.

BACKGROUND INFORMATION

Field of the Disclosure

The present invention relates generally to power converters, and more specifically for providing an alternative input power in response to a hold-up condition.

Background

Electronic devices (such as cell phones, tablets, laptops, etc.) use power to operate. Switched mode power supplies are commonly used due to their high efficiency, small size, and low weight to power many of today's electronics. Conventional wall sockets provide a high voltage alternating current. In a switching power supply, a high voltage alternating current (ac) input is converted with switched mode power converters to provide a well-regulated direct current (dc) output through an energy transfer element to a load. In operation, a switch is turned ON and OFF to provide the desired output by varying the duty cycle (typically the ratio of the on time of the switch to the total switching period), varying the switching frequency, or varying the number of on/off pulses per unit time of the switch in a switched mode power converter.

Power supplies can receive an ac input and provide a dc regulated output. The power supply can include a first-stage power converter and a second-stage power converter. The first-stage converter receives an ac input and generates a dc output, which is stored on a first-stage capacitor that is used as the input to the second-stage converter to generate the dc regulated output. In the event of an ac line dropout, which can occur when the ac input is removed, the ac input drops to 0 V ac. The first-stage power converter is then unable to replenish the energy stored on the first-stage capacitor, which allows the voltage on the capacitor to fall until it becomes too low for the second-stage power converter to provide a dc regulated output. In some designs, the power supply must guarantee regulation of the output for a given amount of time after an interruption or loss of an ac input, referred to as a hold-up time.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a power supply with a reservoir capacitor that can provide an alternative source of input power when necessary are described herein. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment," "an embodiment," "one example," or "an example" means that a particular feature, structure or characteristic described in connection with the embodiment or example is included in at least one embodiment of the present invention. Thus, appearances of the phrases "in one embodiment," "in an embodiment," "one example," or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

For power supplies with a first-stage power converter and a second stage power converter, the first-stage power converter receives an ac input and generates a dc output, which is stored on a first-stage capacitor. The first-stage capacitor is used as the input to the second-stage converter to generate the dc regulated output. In the event of an ac line dropout, which can occur when the ac input is removed, the ac input drops to 0 V ac. The first-stage power converter is then unable to replenish the energy stored on the first-stage capacitor, which can cause the voltage on the capacitor to fall until it becomes too low for the second-stage power converter to provide a dc regulated output. In some designs, the power supply must guarantee regulation of the output for a given amount of time after an interruption or loss of an ac input, referred to as a hold-up time. Only a portion of the energy in the first-stage capacitor is available for hold-up because the second-stage converter requires a minimum operating voltage that is substantially greater than zero to provide the regulated output voltage of the power supply. As such, the first-stage capacitor may need to be electrically and physically larger than desired to provide sufficient energy to guarantee the required hold-up time. To guarantee regulation for the hold-up time in a smaller size first-stage capacitor, the power supply can further include a reservoir capacitor that is initially charged to a relatively high dc voltage by a first-stage power converter and unused during normal operation. In some designs, the rated voltage of the reservoir capacitor is the same as the first-stage capacitor that is permanently coupled to the input of the second-stage power converter. Furthermore, an equivalent series resistance (ESR) of the first-stage capacitor can be greater than the ESR of the reservoir capacitor. The reservoir capacitor is used as an input to the first-stage power converter when an ac line dropout occurs. In another example, the reservoir capacitor can be connected to an input of the second-stage power converter when the input of the second-stage power converter falls below a threshold voltage.

As will be discussed below, it may be possible to achieve either a lower volume or a more desirable packaging configuration for a power supply by portioning the capacitance needed for energy storage after ac line dropout into separate capacitors with different voltage ratings and still maintain sufficient energy storage to guarantee a hold-up time after ac line dropout for a multi-stage power converter.

Figure 1:
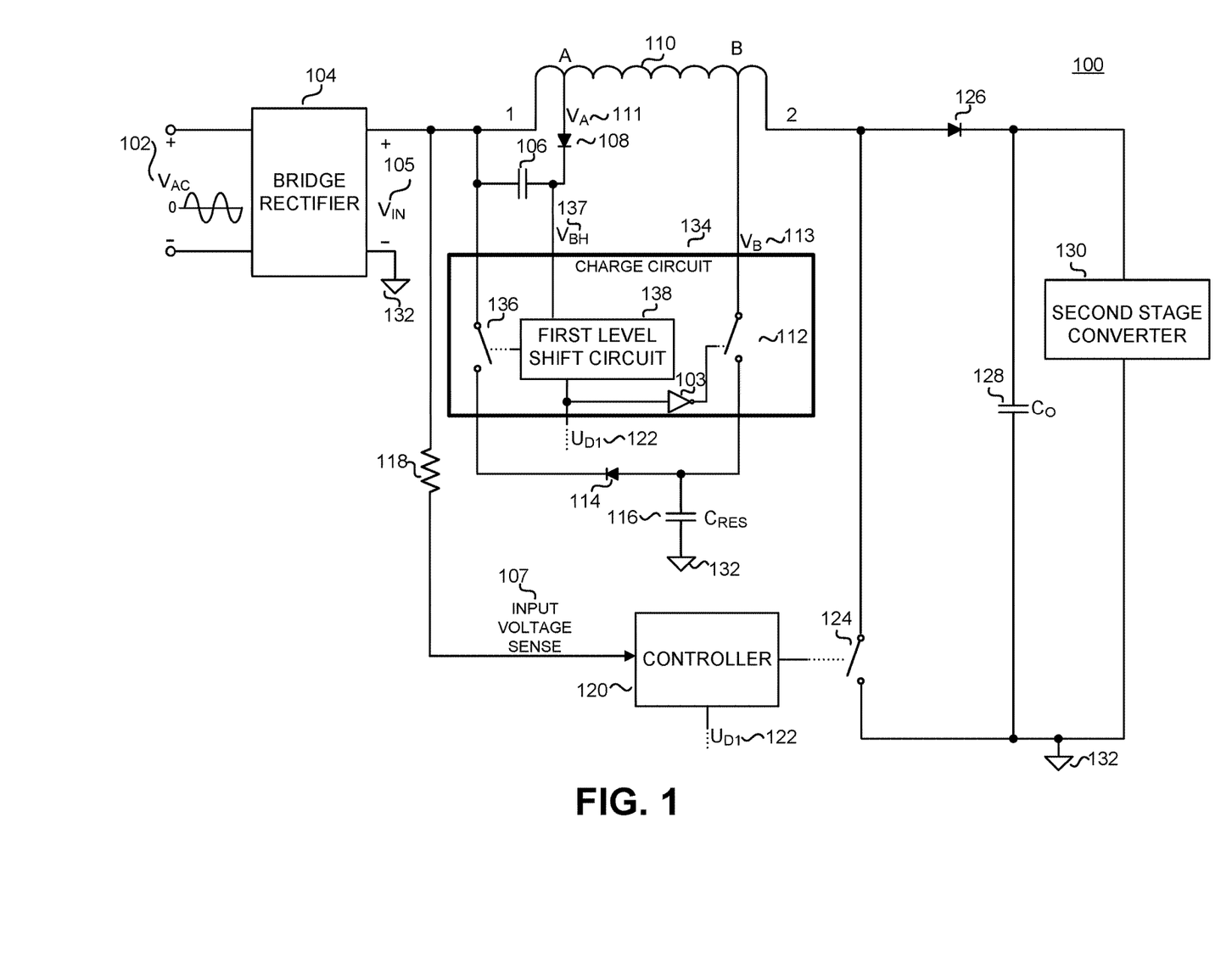
FIG. 1 illustrates one example of a power converter with a charge circuit that provides power to a second stage power converter, in accordance with embodiments of the present disclosure

To illustrate, FIG. 1 is a power converter with a charge circuit that provides power to a second-stage converter. In the example of FIG. 1, the power converter 100 is a boost converter. In other examples, the power converter 100 can be a boost converter with power factor correction (PFC). The power converter 100 includes a bridge rectifier 104 configured to receive an ac input voltage $V_{AC}$ 102. The bridge rectifier 104 is configured to generate a rectified voltage $V_{IN}$ 105. When the power switch 124 is closed, the energy transfer element 110 stores energy in its magnetic field. In the example of FIG. 1, the energy transfer element 110 is an inductor. When the power switch 124 is open, energy is transferred from the energy transfer element 110 to a first-stage capacitor $C_O$ 128 via an output rectifier 126. The output rectifier 126 is illustrated as a diode that converts the ac current output from the energy transfer element 110 into a dc output. The first-stage capacitor $C_O$ 128 provides a regulated power to a second stage power converter 130. In other examples, the first-stage capacitor $C_O$ 128 can be referred to as the first capacitor.

FIG. 1 further includes a reservoir capacitor $C_{RES}$ 116, a controller 120, and a charge circuit 134. In other examples, the reservoir capacitor $C_{RES}$ 116 can be referred to as a second capacitor. In general, the reservoir capacitor $C_{RES}$ 116 is initially charged to a relatively high dc voltage by the boost converter and unused during normal operation and used as an input to the boost converter when an ac line dropout occurs. The reservoir capacitor $C_{RES}$ 116 is coupled to the energy transfer element 110 through a switch 112. One end of the switch 112 is coupled to a tap winding of the energy transfer element 110, and the other end of the switch 112 is coupled to the reservoir capacitor $C_{RES}$ 116. One end of reservoir capacitor $C_{RES}$ 116 is coupled to diode 114, and the other end of reservoir capacitor $C_{RES}$ 116 is coupled to an input return 132. The reservoir capacitor $C_{RES}$ 116 is configured to be charged by a tap winding of the energy transfer element 110 when the switch 112 is closed. A logic low of the hold-up signal $U_{D1}$ 122 transitions to a logic high by an inverter 103, which closes a switch 112.

A tap winding of the energy transfer element 110 can be defined as a portion of the energy transfer element such that a voltage is generated, which is a lower voltage than the output of the energy transfer element 110. For example, the input of energy transfer element 110 is referred to as terminal 1, and the output of energy transfer element 110 is referred to as terminal 2. At tap winding A, a voltage $V_A$ 111 is generated between A and terminal 1. At tap winding B, a voltage $V_B$ 113 is generated between B and terminal 2. The voltage the reservoir capacitor $C_{RES}$ 116 is charged to can be defined by a turns ratio of the energy transfer element 110 relative to an output of the energy transfer element 110 coupled to the first-stage capacitor $C_O$ 128. For energy transfer element 110, the number turns of tap winding B are greater than the number of turns of tap winding A. In the example of FIG. 1, the reservoir capacitor $C_{RES}$ 116 could be configured to charge to a voltage lower than a voltage the first-stage capacitor from the energy transfer element 110. The reservoir capacitor $C_{RES}$ 116 is initially charged to a relatively high dc voltage by tap winding B that when the switch 112 is closed and unused during normal operation and used as an input to the boost converter when an ac line dropout occurs.

The controller 120 is configured to control the power switch 124 to control a transfer of energy from an input of the power converter 100 to the first-stage capacitor $C_O$ 128. Furthermore, the controller 120 is configured to receive an input voltage sense signal 107 representative of the rectified voltage $V_{IN}$ 105 through a resistor 118 in order to determine if a hold-up condition such as ac line dropout has occurred. Controller 120 is configured to generate a hold-up signal $U_{D1}$ 122 in response to a detection of an ac line dropout. In another example, the controller 120 may be configured to generate a hold-up signal $U_{D1}$ 122 in response to an input of the power converter 100 falling below a threshold voltage. In another example, the controller 120 may be referred to as a boost converter controller. In a further example, the controller 120 may be referred to as a power factor correction (PFC) controller.

If a detection of an ac line dropout has occurred, the charge circuit 134 is configured to receive the hold-up signal $U_{D1}$ 122 from the controller 120 to control the switches 112 and 136. A logic high of the hold-up signal $U_{D1}$ 122 is configured to turn off the switch 112 via the inverter 103. The switch 136 is configured to couple the reservoir capacitor $C_{RES}$ 116 to the input of the energy transfer element 110 in response to the hold-up signal $U_{D1}$ 122. The reservoir capacitor $C_{RES}$ 116 thus provides a hold-up energy for the required hold-up energy time. The charge circuit 134 includes a first level shift circuit 138. The hold-up signal $U_{D1}$ 122 can be a low voltage signal that would be unable to turn on the switch 136 directly. The first level shift circuit 138 is configured to receive a bias voltage $V_{BH}$ 137 generated by the tap winding A with a voltage $V_A$ 111, the capacitor 106 and diode 108 in order to provide an adequate voltage to drive the switch 136. In one embodiment, the switch 112 can be turned off by a signal generated by the charge circuit 134 or the controller 122.

Figure 2:
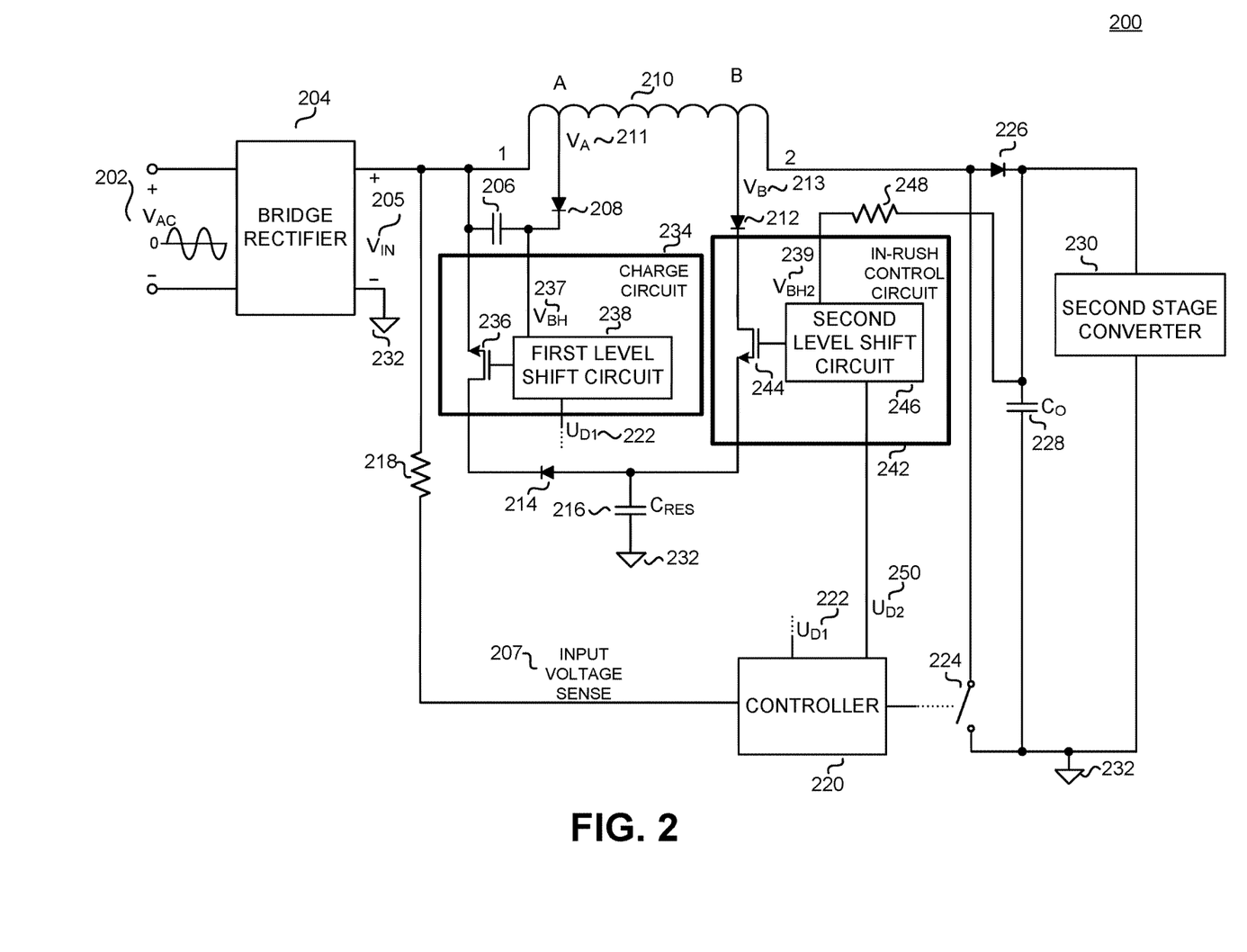
FIG. 2 illustrates one example of a power converter with charge circuit and an in-rush control circuit, in accordance with embodiments of the present disclosure.

FIG. 2 illustrates one example of a power converter with charge circuit and an in-rush control circuit. It is appreciated that the signals illustrated in FIG. 2 may be examples of corresponding signals illustrated or described above in FIG. 1, and that similarly named and numbered signals referenced below are coupled and function similar to as described above.

FIG. 2 further includes an in-rush control circuit 242 configured to limit the in-rush current by providing an in-rush current control while charging the reservoir capacitor $C_{RES}$ 216. The in-rush control circuit 242 can replace components such as negative temperature coefficient (NTC) resistors and parallel relays traditionally used to limit in-rush current. The in-rush control circuit 242 includes a second level shift circuit 246 and a switch 244. The controller 220 is configured to generate a charge signal $U_{D2}$ 250 to control the switch 244. The charge signal $U_{D2}$ 250 can be a low voltage signal that would be unable to directly turn on switch 244 directly. The second level shift circuit 246 is configured to receive a second bias voltage $V_{BH2}$ 239 generated by the first-stage capacitor 228 and resistor 248 to drive the switch 244. It is recognized that this second bias voltage could be derived from a bias supply generated by other means such as an auxiliary winding from energy transfer element 210 or an auxiliary output from second stage converter 230, to provide power to the in-rush control circuit 242. As such, the in-rush current can be reduced by the switch 244 when charging the reservoir capacitor $C_{RES}$ 216.

In operation, the controller 220 can generate a charge signal $U_{D2}$ 250 to the in-rush control circuit 242 to charge the reservoir capacitor $C_{RES}$ 216. The in-rush control circuit 242 is configured to control the switch 244 in response to the charge signal $U_{D2}$ 250. If an ac line dropout is detected by the controller 220 by the input voltage sense 207, the controller 220 is configured to generate a hold-up signal $U_{D1}$ 222. The charge circuit 234 is configured to close the switch 236 in response to the hold-up signal $U_{D1}$ 222. When the switch 236 is closed, the reservoir capacitor $C_{RES}$ 216 is coupled to the input of the energy transfer element 210 through the diode 214. The reservoir capacitor $C_{RES}$ 216 provides a hold-up energy for the required hold-up energy time. In one embodiment, charge signal $U_{D2}$ 222 is also used to communicate a hold-up signal to in-rush control circuit 242 such that switch 244 is opened during the hold-up period while switch 236 is closed. In another embodiment not shown, hold-up signal $U_{D1}$ 222 could be coupled to the in-rush control circuit 242 to ensure that switch 244 is opened during the hold-up period while switch 236 is closed.

Figure 3A:
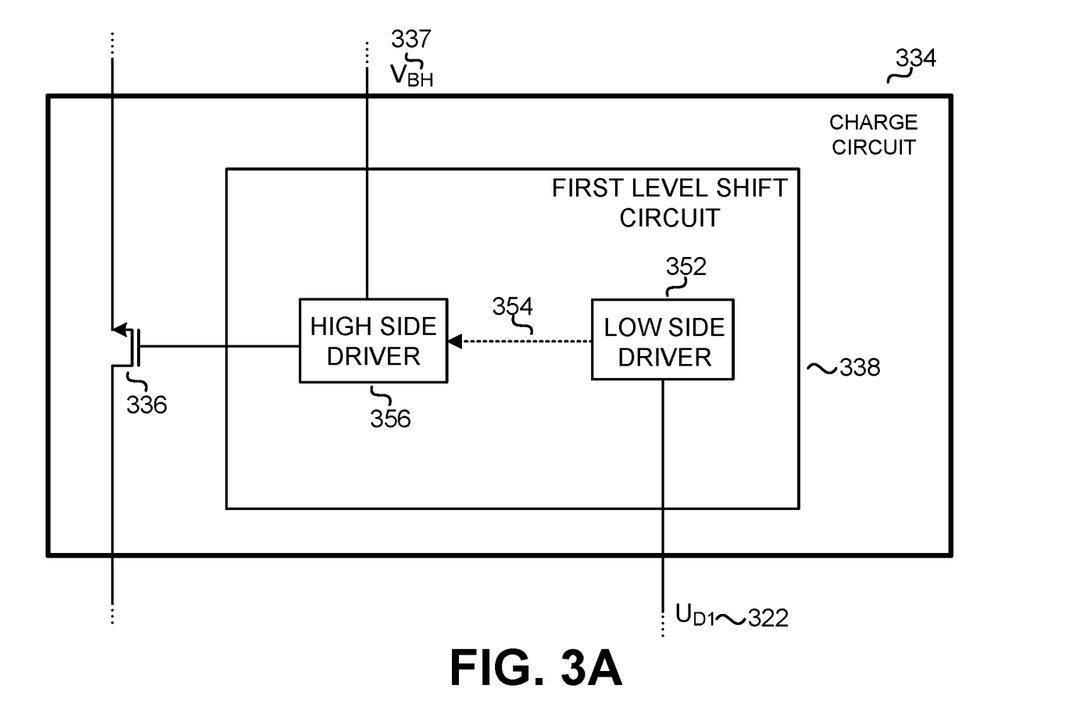
FIG. 3A illustrates one example of a charge circuit of FIG. 1 and FIG. 2.

FIG. 3A illustrates one example of a charge circuit of FIG. 1 and FIG. 2. It is appreciated that the signals illustrated in FIG. 3 may be examples of corresponding signals illustrated or described above in FIGS. 1 and 2, and that similarly named and numbered signals referenced below are coupled and function similar to as described above. FIG. 3A includes a charge circuit 334 that is configured to control the switch 336 in response to a hold-up signal $U_{D1}$ 322.

The charge circuit 334 includes a first level shift circuit 338. The first level shift circuit 338 includes a low side driver 352 and a high side driver 356. In operation, the low side driver 352 is configured to receive the hold-up signal $U_{D1}$ 322 from the controller. The low side driver 352 communicates across a communication link 354 to the high side driver 356 in response to the hold-up signal $U_{D1}$ 322. In one example, the communication link 360 can comprise a magnetic coupling between the high side driver 356 and the low side driver 352. In another example, the communication link 354 can comprise an optical coupling between the high side driver 356 and the low side driver 352. In a further example, the communication link 354 can comprise a capacitive coupling between the high side driver 356 and the low side driver 352. In a further example, the communication link 354 can comprise a direct coupling using for example a high voltage MOSFET coupled between the high side driver 356 and the low side driver 352. The high side driver 356 is configured to receive a bias voltage $V_{BH}$ 337 that is used to control the switch 336 for coupling the reservoir capacitor the input of the energy transfer element when an ac line dropout condition occurs.

Figure 3B:
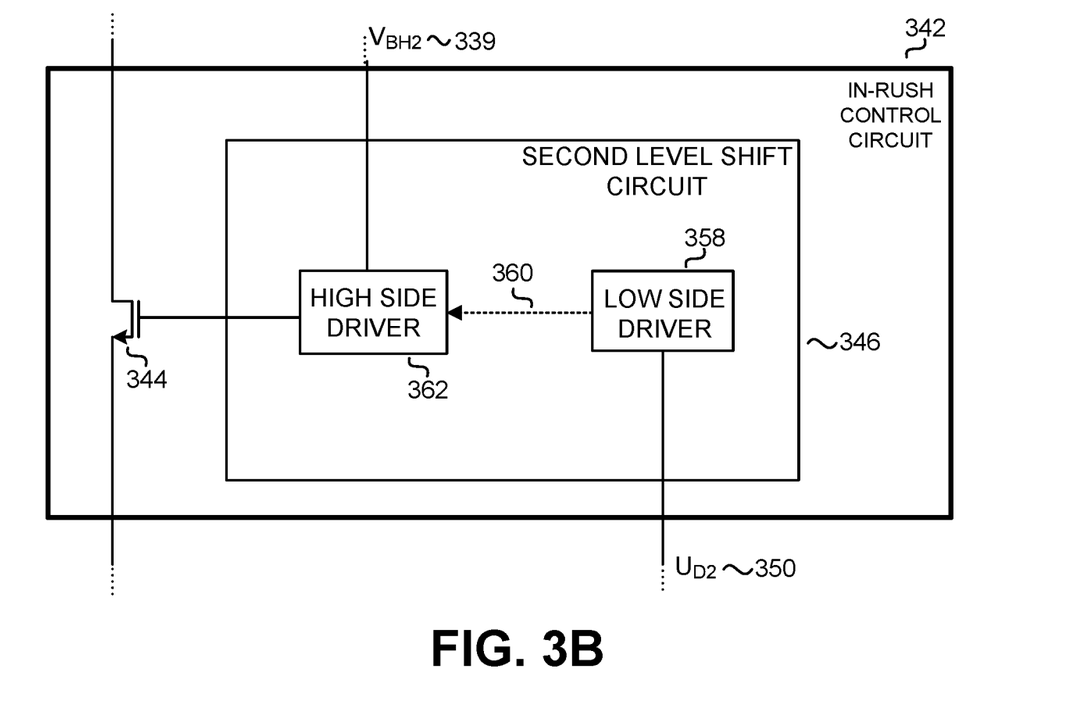
FIG. 3B illustrates one example of an in-rush control circuit of FIG. 2.

FIG. 3B illustrates one example of an in-rush circuit shown in FIG. 2. It is appreciated that the signals illustrated in FIG. 3 may be examples of corresponding signals illustrated or described above in FIG. 1 and FIG. 2, and that similarly named and numbered signals referenced below are coupled and function similar to as described above. FIG. 3B includes an in-rush control circuit 342 that is configured to control the switch 344 in response to a charge signal $U_{D2}$ 350.

The in-rush control circuit 342 includes a second level shift circuit 346. The second level shift circuit 346 includes a low side driver 358 and a high side driver 362. In operation, the low side driver 358 is configured to receive the charge signal $U_{D2}$ 350 from the controller. The low side driver 358 communicates across a communication link 360 to the high side driver 362 in response to the charge signal $U_{D2}$ 322. In one example, the communication link 360 can comprise a magnetic coupling between the high side driver 362 and the low side driver 358. In another example, the communication link 360 can comprise an optical coupling between the high side driver 362 and the low side driver 358. In a further example, the communication link 360 can comprise a capacitive coupling between the high side driver 362 and the low side driver 358. In a further example, the communication link 360 can comprise a direct coupling using for example a high voltage MOSFET coupled between the high side driver 362 and the low side driver 358. The high side driver 362 is configured to receive a bias voltage $V_{BH}$ 339 that is used to control the switch 344 to limit the in-rush current when charging the reservoir capacitor.

Figure 4:
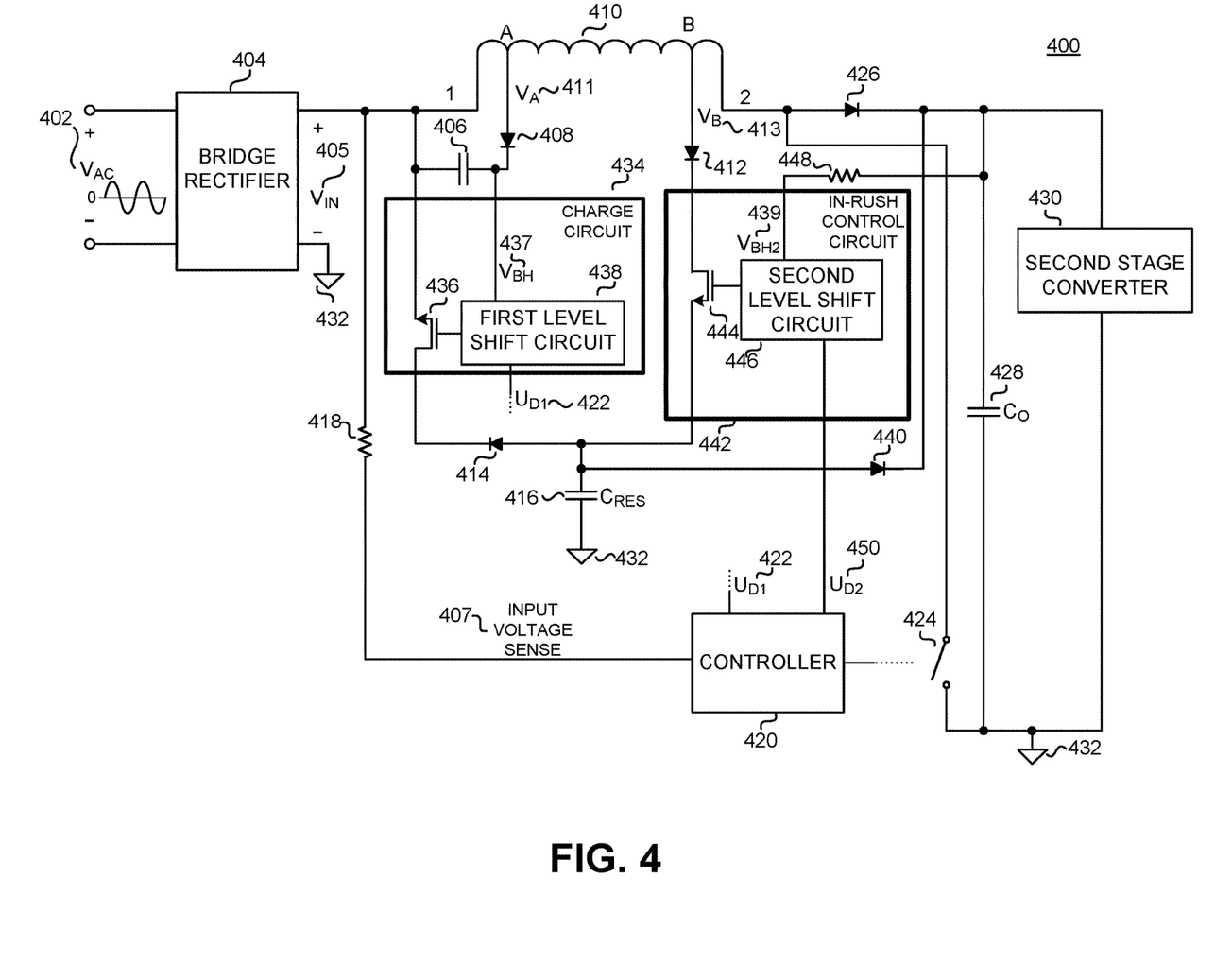
FIG. 4 illustrates another example of a power converter with a charge circuit and an in-rush control circuit that provides power with to a second stage power converter, in accordance with embodiments of the present disclosure.

FIG. 4 illustrates another example of a power converter with a charge circuit and an in-rush control circuit controlled by a controller. It is appreciated that the signals illustrated in FIG. 4 may be examples of corresponding signals illustrated or described above in FIGS. 1-3, and that similarly named and numbered signals referenced below are coupled and function similarly to signals described above.

In FIG. 4, the operation of the power converter 400 is substantially the same as described in the previous figures. In this example, the reservoir capacitor $C_{RES}$ 416 is coupled in parallel to the first-stage capacitor $C_O$ 428 via a fourth diode 440 in order to reduce output ripple. One end of reservoir capacitor $C_{RES}$ 416 is coupled to an anode of the fourth diode 440, and a cathode of the fourth diode 440 is coupled to the first-stage capacitor $C_O$ 428. The switch 444 is controlled to ensure the reservoir capacitor $C_{RES}$ 416 is clamped to a voltage below the first-stage capacitor $C_O$ 428.

Figure 5:
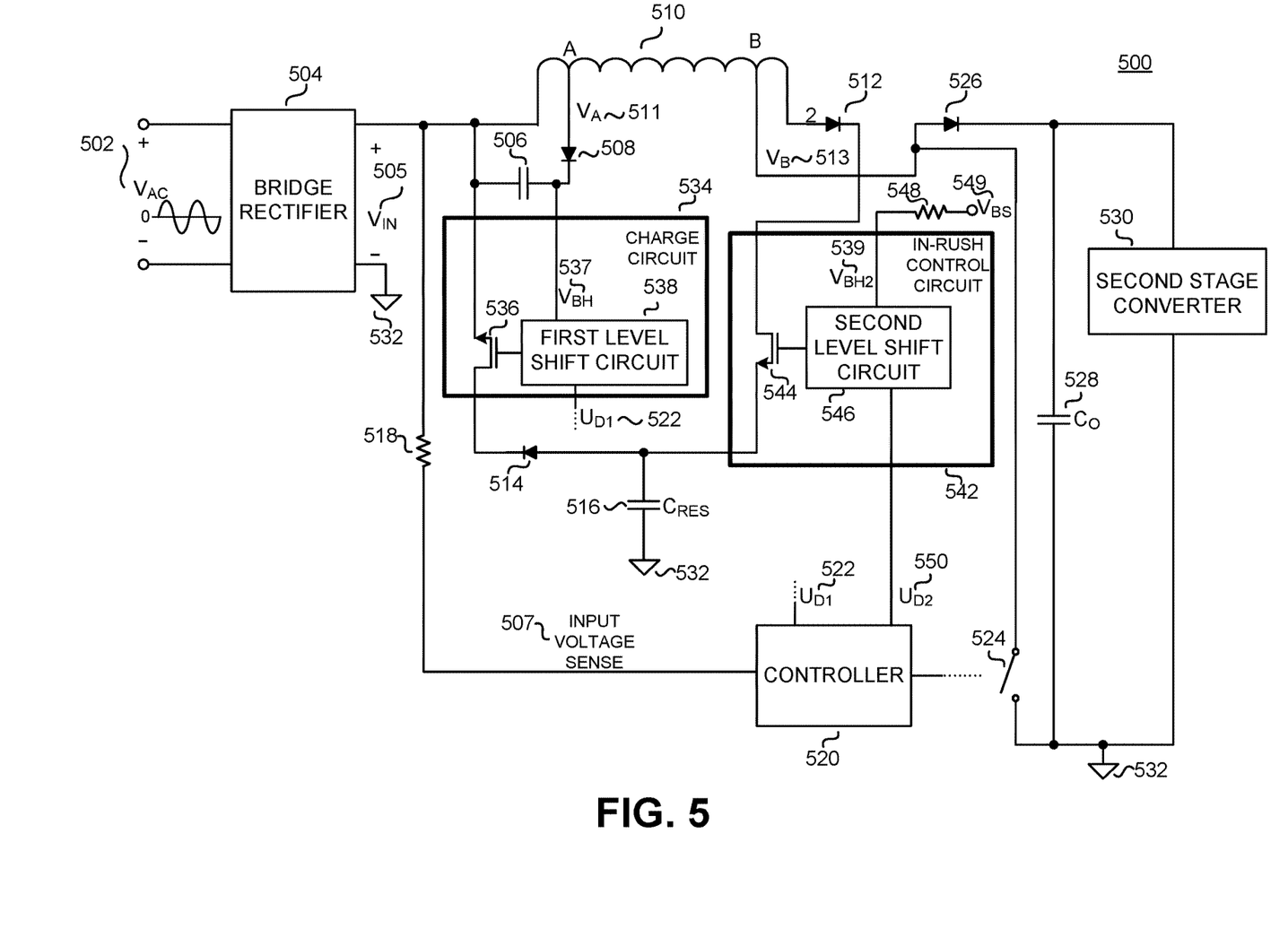
FIG. 5 illustrates a further example of a power converter with a charge circuit and an in-rush control circuit that provides power to a second stage power converter, in accordance with embodiments of the present disclosure.

FIG. 5 illustrates another example of a power converter with a charge circuit and an in-rush control circuit controlled by a controller. It is appreciated that the signals illustrated in FIG. 5 may be examples of corresponding signals illustrated or described above in FIGS. 1-4, and that similarly named and numbered signals referenced below are coupled and function similar to as described above.

In FIG. 5, the operation of the power converter 500 is substantially the same as described in the previous figures.

In this example, the reservoir capacitor $C_{RES}$ 516 is configured to be charged by the energy transfer element 510 to a voltage higher than a voltage of the first-stage capacitor $C_{OUT}$ 528. In other words, the first-stage capacitor $C_{OUT}$ 528 is charged to an output voltage less than the reservoir capacitor $C_{RES}$ 516. In one example, the configuration of FIG. 5 may be used when using a voltage rating for $C_{RES}$ 516 that is higher than the voltage rating for the first-stage capacitor $C_O$ 528 which can provide a benefit of a smaller physical size of reservoir capacitor. A second bias voltage $V_{BH2}$ 539 could be derived from a bias supply $V_{BS}$ 549 generated by other means such as an auxiliary winding from energy transfer element 510 or an auxiliary output from second stage converter 530, to provide power to the in-rush control circuit 542. The same benefits as mentioned in the previous figures can be applied to FIG. 5.

Figure 6:
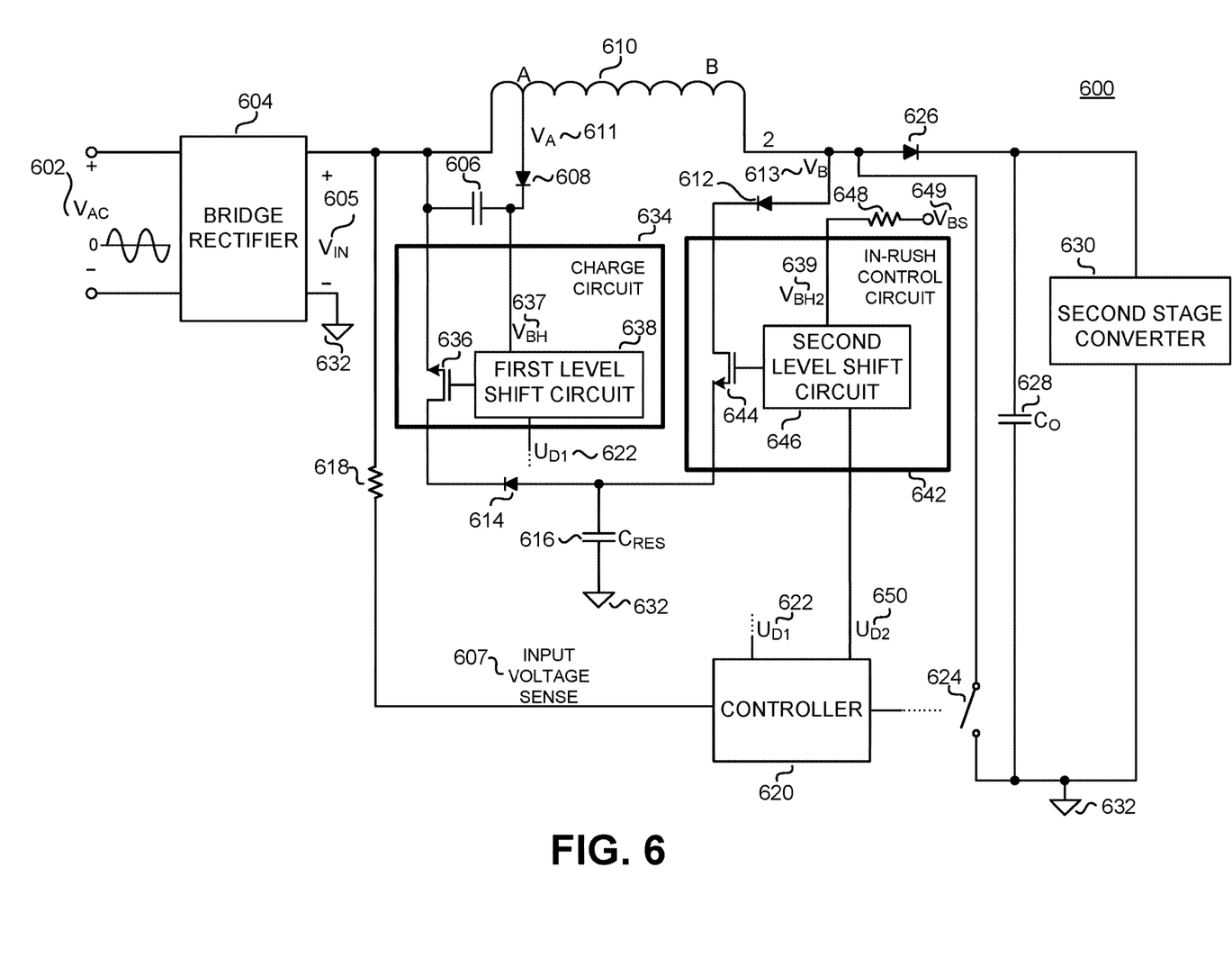
FIG. 6 illustrates a further example of a power converter that provides power to a second stage power converter, in accordance with embodiments of the present disclosure.

FIG. 6 illustrates another example of a power converter with a charge circuit and an in-rush control circuit controlled by a controller. It is appreciated that the signals illustrated in FIG. 6 may be examples of corresponding signals illustrated or described above in FIGS. 1-5, and that similarly named and numbered signals referenced below are coupled and function similar to as described above.

In FIG. 6, the operation of the power converter 600 is substantially the same as described in the previous figures. In this example, the reservoir capacitor $C_{RES}$ 616 and the first-stage capacitor $C_{OUT}$ 628 are configured to charge to the same voltage because the reservoir capacitor $C_{RES}$ 616 is coupled to the energy transfer element 610 when the switch 644 is closed. Furthermore, the output of the energy transfer element 610 is coupled to the output rectifier. A second bias voltage $V_{BH2}$ 639 could be derived from a bias supply $V_{BS}$ 649 generated by other means such as an auxiliary winding from energy transfer element 610 or an auxiliary output from second stage converter 630, to provide power to the in-rush control circuit 642. The same benefits as mentioned in the previous figures can be applied to FIG. 6.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

Although the present invention is defined in the claims, it should be understood that the present invention can alternatively be defined in accordance with the following examples:

Example 1

A power supply comprising: a first-stage capacitor configured to provide energy to a second stage power converter; an energy transfer element coupled to the first-stage capacitor; a reservoir capacitor coupled to the energy transfer element, the reservoir capacitor configured to receive charge from the energy transfer element; a power switch configured to control a transfer of energy from an input of the power supply to the first-stage capacitor; a controller coupled to the power switch, the controller configured to generate a hold-up signal in response to the input of the power supply falling below a threshold voltage; and a charge circuit, comprising: a first switch configured to provide a coupling of the reservoir capacitor to an input of the energy transfer element in response to the hold-up signal; and a second switch coupled to a tap winding of the energy transfer element, the second switch configured to uncouple the reservoir capacitor from receiving charge from the energy transfer element in response to the hold-up signal.

Example 2

The power supply of example 1, wherein one end of the reservoir capacitor is coupled to an anode of a first diode, and a cathode of the first diode is coupled to the first-stage capacitor.

Example 3

The power supply of any of the previous examples, further comprising an in-rush control circuit coupled to the energy transfer element, the in-rush control circuit configured to charge the reservoir capacitor.

Example 4

The power supply of any of the previous examples, the charge circuit further comprising a first level shift circuit, the first level shift circuit configured to control the first switch in response to the hold-up signal from the controller.

Example 5

The power supply of any of the previous examples, the in-rush control circuit comprising a second level shift circuit, the second level shift circuit configured to control the second switch in response to a charge signal from the controller.

Example 6

The power supply of any of the previous examples, the first level shift circuit comprising: a low side driver configured to receive the hold-up signal from the controller; a communication link coupled to the low side driver, the low side driver configured to communicate across the communication link in response to the hold-up signal; and a high side driver coupled to the communication link, the high side driver configured to control the first switch.

Example 7

The power supply of any of the previous examples, the second level shift circuit comprising: a second low side driver configured to receive the charge signal from the controller; a second communication link coupled to the second low side driver, the second low side driver configured to communicate across the second communication link in response to the hold-up signal; and a second high side driver coupled to the second communication link, the second high side driver configured to control the second switch.

Example 8

The power supply of any of the previous examples, the second level shift circuit configured to control the second switch to provide in-rush current control for the reservoir capacitor.

Example 9

The power supply of any of the previous examples, the reservoir capacitor coupled to a tap of the energy transfer element, the reservoir capacitor configured to be charged to a voltage less than the first-stage capacitor by the energy transfer element.

Example 10

The power supply of any of the previous examples, wherein a voltage of the reservoir capacitor is defined by a turns ratio of the tap of the energy transfer element relative to an output of the energy transfer element coupled to the first-stage capacitor.

Example 11

The power supply of any of the previous examples, wherein the reservoir capacitor is coupled in parallel to the first-stage capacitor via a second diode.

Example 12

The power supply of any of the previous examples, the reservoir capacitor configured to be charged to a voltage higher than a voltage of the first-stage capacitor.

Example 13

The power supply of any of the previous examples, further comprising a capacitor coupled to the input of the energy transfer element, the energy transfer element configured to charge the capacitor to provide a bias voltage for the first level shift circuit.

Example 14

A boost converter, comprising: an inductor configured to transfer of energy from an input of the boost converter to an output of the boost converter; a boost converter controller configured to control the transfer of energy from the input of the boost converter to the output of the boost converter, the boost converter controller further configured to receive an input voltage sense signal representative of an input voltage of the boost converter; a first switch coupled to the inductor; a second switch coupled to the first switch; and a reservoir capacitor coupled to the first switch, the reservoir capacitor coupled to an input of the boost converter when the second switch is on and the first switch is off.

Example 15

The boost converter of example 14, the boost converter controller configured to generate a hold-up signal in response a hold-up condition determined by the input voltage sense signal.

Example 16

The boost converter of any of the previous examples, further comprising a charge circuit configured to control the first switch and the second switch in response to the hold-up signal.

Example 17

The boost converter of any of the previous examples, further comprising an in-rush control circuit configured to control the first switch to limit an in-rush current of the reservoir capacitor in response to a charge signal from the boost converter controller.

Example 18

The boost converter of any of the previous examples, the charge circuit further comprising a first level shift circuit, the first level shift circuit comprising: a low side driver configured to receive the hold-up signal from the boost converter controller; a high side driver configured to control the second switch in response to the hold-up signal received by the low side driver; and a communication link coupled to the high side driver and the low side driver.

Example 19

The boost converter of any of the previous examples, the in-rush control circuit further comprising a second level shift circuit, the second level shift circuit comprising: a second low side driver configured to receive the charge signal from the boost converter controller; a second high side driver configured to control the first switch in response to the charge signal received by the second low side driver; and a second communication link coupled to the second high side driver and the second low side driver.

Example 20

The boost converter of any of the previous examples, wherein the communication link comprises a magnetic coupling between the high side driver and the low side driver.

Example 21

The boost converter of any of the previous examples, wherein the communication link comprises an optical coupling between the high side driver and the low side driver.

Example 22

The boost converter of any of the previous examples, wherein the communication link comprises a capacitive coupling between the high side driver and the low side driver.

Example 23

The boost converter of any of the previous examples, wherein the communication link comprises a direct coupling of a high voltage MOSFET coupled between the high side driver and the low side driver.

Example 24

A power supply with power factor correction (PFC), comprising a first capacitor coupled between an inductor and a second stage power converter, the first capacitor configured to be charged by the inductor; a second capacitor coupled to the inductor, the second capacitor configured to be charged by the inductor to maintain a hold-up energy; a PFC controller configured to control a power switch to transfer energy from the inductor to the second stage power converter, the PFC controller further configured to generate a hold-up signal in response to a detection of an AC line dropout; and a charge circuit configured to control a first switch in response to the hold-up signal, the first switch configured to couple the second capacitor to the inductor.

Example 25

The power supply of example 24, further comprising an in-rush control circuit, the in-rush control circuit coupled to the inductor, the in-rush control circuit configured to control a second switch that provides an in-rush current control to charge the second capacitor.

Example 26

The power supply of any of the previous examples, the in-rush control circuit coupled to a tap of the inductor via the second switch.

Example 27

The power supply of any of the previous examples, wherein the second capacitor is charged to an output voltage lower than a voltage of the first capacitor.

Example 28

The power supply of any of the previous examples, the second capacitor is charged to a voltage higher than a voltage of the first capacitor.

Example 29

The power supply of any of the previous examples, the charge circuit comprising a first level shift circuit, the first level shift circuit comprising: a low side driver configured to receive the hold-up signal from the PFC controller; a high side driver configured to control the first switch in response to the hold-up signal received by the low side driver; and a communication link coupled to the high side driver and the low side driver.

Example 30

The power supply of any of the previous examples, wherein the in-rush control circuit comprises a second level shift circuit, the second level shift circuit comprising: a second low side driver configured to receive a charge signal from the PFC controller; a second high side driver configured to control the second switch in response to the charge signal received by the second low side driver; and a second communication link coupled to the second high side driver and the second low side driver.

Example 31

The power supply of any of the previous examples, the second capacitor coupled in parallel to the first capacitor via a diode.

Example 32

The power supply of any of the previous examples, the PFC controller configured to receive an input voltage sense signal to detect the ac line dropout.

Example 33

The power supply of any of the previous examples, wherein an equivalent series resistance (ESR) of the second capacitor is greater than the ESR of the first capacitor.

What is claimed is:

1. A power supply comprising:
    a first-stage capacitor configured to provide energy to a second stage power converter;
    an energy transfer element coupled to the first-stage capacitor;
    a reservoir capacitor coupled to the energy transfer element, the reservoir capacitor configured to receive charge from the energy transfer element;
    a power switch configured to control a transfer of energy from an input of the power supply to the first-stage capacitor;
    a controller coupled to the power switch, the controller configured to generate a hold-up signal in response to the input of the power supply falling below a threshold voltage; and
    a charge circuit, comprising:
        a first switch configured to provide a coupling of the reservoir capacitor to an input of the energy transfer element in response to the hold-up signal; and
        a second switch coupled to a tap winding of the energy transfer element, the second switch configured to uncouple the reservoir capacitor from receiving charge from the energy transfer element in response to the hold-up signal.

2. The power supply of claim 1, wherein one end of the reservoir capacitor is coupled to an anode of a first diode, and a cathode of the first diode is coupled to the first-stage capacitor.

3. The power supply of claim 1, further comprising an in-rush control circuit coupled to the energy transfer element, the in-rush control circuit configured to charge the reservoir capacitor.

4. The power supply of claim 1, the charge circuit further comprising a first level shift circuit, the first level shift circuit configured to control the first switch in response to the hold-up signal from the controller.

5. The power supply of claim 3, the in-rush control circuit comprising a second level shift circuit, the second level shift circuit configured to control the second switch in response to a charge signal from the controller.

6. The power supply of claim 4, the first level shift circuit comprising:
    a low side driver configured to receive the hold-up signal from the controller;
    a communication link coupled to the low side driver, the low side driver configured to communicate across the communication link in response to the hold-up signal; and
    a high side driver coupled to the communication link, the high side driver configured to control the first switch.

7. The power supply of claim 5, the second level shift circuit comprising:
    a second low side driver configured to receive the charge signal from the controller;
    a second communication link coupled to the second low side driver, the second low side driver configured to communicate across the second communication link in response to the hold-up signal; and
    a second high side driver coupled to the second communication link, the second high side driver configured to control the second switch.

8. The power supply of claim 7, the second level shift circuit configured to control the second switch to provide in-rush current control for the reservoir capacitor.

9. The power supply of claim 1, the reservoir capacitor coupled to a tap of the energy transfer element, the reservoir capacitor configured to be charged to a voltage less than the first-stage capacitor by the energy transfer element.

10. The power supply of claim 9, wherein a voltage of the reservoir capacitor is defined by a turns ratio of the tap of the energy transfer element relative to an output of the energy transfer element coupled to the first-stage capacitor.

11. The power supply of claim 1, wherein the reservoir capacitor is coupled in parallel to the first-stage capacitor via a second diode.

12. The power supply of claim 1, the reservoir capacitor configured to be charged to a voltage higher than a voltage of the first-stage capacitor.

13. The power supply of claim 6, further comprising a capacitor coupled to the input of the energy transfer element, the energy transfer element configured to charge the capacitor to provide a bias voltage for the first level shift circuit.

14. A boost converter, comprising:
 an inductor configured to transfer of energy from an input of the boost converter to an output of the boost converter;
 a boost converter controller configured to control the transfer of energy from the input of the boost converter to the output of the boost converter, the boost converter controller further configured to receive an input voltage sense signal representative of an input voltage of the boost converter;
 a first switch coupled to the inductor;
 a second switch coupled to the first switch; and
 a reservoir capacitor coupled to the first switch, the reservoir capacitor coupled to an input of the boost converter when the second switch is on and the first switch is off.

15. The boost converter of claim 14, the boost converter controller configured to generate a hold-up signal in response a hold-up condition determined by the input voltage sense signal.

16. The boost converter of claim 15, further comprising a charge circuit configured to control the first switch and the second switch in response to the hold-up signal.

17. The boost converter of claim 15, further comprising an in-rush control circuit configured to control the first switch to limit an in-rush current of the reservoir capacitor in response to a charge signal from the boost converter controller.

18. The boost converter of claim 16, the charge circuit further comprising a first level shift circuit, the first level shift circuit comprising:
 a low side driver configured to receive the hold-up signal from the boost converter controller;
 a high side driver configured to control the second switch in response to the hold-up signal received by the low side driver; and
 a communication link coupled to the high side driver and the low side driver.

19. The boost converter of claim 17, the in-rush control circuit further comprising a second level shift circuit, the second level shift circuit comprising:
 a second low side driver configured to receive the charge signal from the boost converter controller;
 a second high side driver configured to control the first switch in response to the charge signal received by the second low side driver; and
 a second communication link coupled to the second high side driver and the second low side driver.

20. The boost converter of claim 18, wherein the communication link comprises a magnetic coupling between the high side driver and the low side driver.

21. The boost converter of claim 18, wherein the communication link comprises an optical coupling between the high side driver and the low side driver.

22. The boost converter of claim 18, wherein the communication link comprises a capacitive coupling between the high side driver and the low side driver.

23. The boost converter of claim 18, wherein the communication link comprises a direct coupling of a high voltage MOSFET coupled between the high side driver and the low side driver.

24. A power supply with power factor correction (PFC), comprising:
 a first capacitor coupled between an inductor and a second stage power converter, the first capacitor configured to be charged by the inductor;
 a second capacitor coupled to the inductor, the second capacitor configured to be charged by the inductor to maintain a hold-up energy;
 a PFC controller configured to control a power switch to transfer energy from the inductor to the second stage power converter, the PFC controller further configured to generate a hold-up signal in response to a detection of an AC line dropout; and
 a charge circuit configured to control a first switch in response to the hold-up signal, the first switch configured to couple the second capacitor to the inductor.

25. The power supply of claim 24, further comprising an in-rush control circuit, the in-rush control circuit coupled to the inductor, the in-rush control circuit configured to control a second switch that provides an in-rush current control to charge the second capacitor.

26. The power supply of claim 25, the in-rush control circuit coupled to a tap of the inductor via the second switch.

27. The power supply of claim 26, wherein the second capacitor is charged to an output voltage lower than a voltage of the first capacitor.

28. The power supply of claim 26, the second capacitor is charged to a voltage higher than a voltage of the first capacitor.

29. The power supply of claim 24, the charge circuit comprising a first level shift circuit, the first level shift circuit comprising:
 a low side driver configured to receive the hold-up signal from the PFC controller;
 a high side driver configured to control the first switch in response to the hold-up signal received by the low side driver; and
 a communication link coupled to the high side driver and the low side driver.

30. The power supply of claim 25, wherein the in-rush control circuit comprises a second level shift circuit, the second level shift circuit comprising:
 a second low side driver configured to receive a charge signal from the PFC controller;
 a second high side driver configured to control the second switch in response to the charge signal received by the second low side driver; and
 a second communication link coupled to the second high side driver and the second low side driver.

31. The power supply of claim 25, the second capacitor coupled in parallel to the first capacitor via a diode.

32. The power supply of claim 24, the PFC controller configured to receive an input voltage sense signal to detect the ac line dropout.

33. The power supply of claim 24, wherein an equivalent series resistance (ESR) of the second capacitor is greater than the ESR of the first capacitor.

\* \* \* \* \*